United States Patent
Singh et al.

(10) Patent No.: US 11,237,479 B2
(45) Date of Patent: *Feb. 1, 2022

(54) CONFIGURING OPTICAL LAYERS IN IMPRINT LITHOGRAPHY PROCESSES

(71) Applicant: Molecular Imprints, Inc., Austin, TX (US)

(72) Inventors: Vikramjit Singh, Pflugerville, TX (US); Michael N. Miller, Austin, TX (US); Frank Y. Xu, Austin, TX (US); Christopher Fleckenstein, Round Rock, TX (US)

(73) Assignee: Molecular Imprints, Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/920,042

(22) Filed: Jul. 2, 2020

(65) Prior Publication Data

US 2020/0333705 A1    Oct. 22, 2020

Related U.S. Application Data

(63) Continuation of application No. 16/455,182, filed on Jun. 27, 2019, now Pat. No. 10,747,108, which is a
(Continued)

(51) Int. Cl.
*G03F 7/00* (2006.01)
*G03F 7/16* (2006.01)
(Continued)

(52) U.S. Cl.
CPC ......... *G03F 7/0002* (2013.01); *G02B 5/1857* (2013.01); *G02F 1/13394* (2013.01);
(Continued)

(58) Field of Classification Search
CPC ............ G02B 2207/101; G02B 5/1857; G02F 1/13394; G02F 2001/13398
See application file for complete search history.

(56) References Cited

U.S. PATENT DOCUMENTS 5,324,683 A   6/1994  Fitch et al.
6,396,559 B1  5/2002  Kishimoto et al.
(Continued)

FOREIGN PATENT DOCUMENTS

EP    1519206 A2    3/2005
EP    3548424       10/2019
(Continued)

OTHER PUBLICATIONS

Extended European Search Report in European Application No. 18747154.5, dated Dec. 3, 2019, 8 pages.
(Continued)

*Primary Examiner* — Michelle M Iacoletti
(74) *Attorney, Agent, or Firm* — Fish & Richardson P.C.

(57) ABSTRACT

An imprint lithography method of configuring an optical layer includes depositing a set of droplets atop a side of a substrate in a manner such that the set of droplets do not contact a functional pattern formed on the substrate. The imprint lithography method further includes curing the set of droplets to form a spacer layer associated with the side of the substrate and of a height selected such that the spacer layer can support a surface adjacent the substrate and spanning the set of droplets at a position spaced apart from the functional pattern.

19 Claims, 9 Drawing Sheets

Related U.S. Application Data continuation of application No. 15/885,294, filed on Jan. 31, 2018, now Pat. No. 10,379,438.

(60) Provisional application No. 62/453,249, filed on Feb. 1, 2017.

(51) Int. Cl.
  G02B 5/18 (2006.01)
  G02F 1/1339 (2006.01)

(52) U.S. Cl.
  CPC .......... G03F 7/0005 (2013.01); G03F 7/168 (2013.01); *G02B 2207/101* (2013.01); *G02F 1/13398* (2021.01)

(56) References Cited

U.S. PATENT DOCUMENTS

| | | |
|---|---|---|
| 10,379,438 B2 | 8/2019 | Singh et al. |
| 10,747,108 B2 | 8/2020 | Singh et al. |
| 2002/0034711 A1 | 3/2002 | Xu et al. |
| 2003/0118922 A1 | 6/2003 | Hayashi et al. |
| 2004/0257416 A1 | 12/2004 | Kim et al. |
| 2010/0165134 A1 | 7/2010 | Dowski, Jr. et al. |
| 2011/0141428 A1 | 6/2011 | Maruyama et al. |
| 2012/0319976 A1 | 12/2012 | Ahn et al. |
| 2016/0026061 A1* | 1/2016 | O'Keeffe .............. G02F 1/1677 359/296 |
| 2017/0248751 A1 | 8/2017 | Koura |
| 2019/0317399 A1 | 10/2019 | Singh et al. |

FOREIGN PATENT DOCUMENTS

| | | |
|---|---|---|
| JP | 03030349 A | 2/1991 |
| JP | 2004-006643 A | 1/2004 |
| JP | 2009-533885 A | 9/2009 |
| JP | 2010-260272 A | 11/2010 |
| TW | 200528769 A | 9/2005 |
| TW | 200912486 A | 3/2009 |
| TW | 201316048 A | 4/2013 |
| WO | WO 2005/012991 | 2/2005 |

OTHER PUBLICATIONS

PCT International Search Report and Written Opinion for International Application No. PCT/US2018/016156, dated Apr. 23, 2018, 16 pages.

JP Office Action in Japanese Appln. No. 2019-541249, dated Mar. 11, 2021, 4 pages (with English translation).

TW Office Action in Taiwan Appln. No. 107103507, dated Apr. 16, 2021, 6 pages (with English translation).

* cited by examiner

CONFIGURING OPTICAL LAYERS IN IMPRINT LITHOGRAPHY PROCESSES

CROSS-REFERENCE TO RELATED APPLICATIONS

This application is a continuation of U.S. application Ser. No. 16/455,182, filed on Jun. 27, 2019, which is a continuation of U.S. application Ser. No. 15/885,294, filed on Jan. 31, 2018, now U.S. Pat. No. 10,379,438, which claims the benefit of the filing date of U.S. Provisional Application No. 62/453,249, filed on Feb. 1, 2017. The contents of U.S. application Ser. Nos. 16/455,182; 15/885,294 and 62/453,249 are incorporated herein by reference in their entirety.

TECHNICAL FIELD

This invention relates to configuring optical layers in imprint lithography processes, and more particularly to forming spacers on a substrate via a drop-on-demand dispensing technique.

BACKGROUND

Nanofabrication (e.g., nanoimprint lithography) can include the fabrication of very small structures that have features on the order of 100 nanometers or smaller. One application in which nanofabrication has had a significant impact is in the processing of integrated circuits. The semiconductor processing industry continues to strive for larger production yields, while increasing a number of circuits formed on a substrate per unit area of the substrate. To this end, nanofabrication has become increasingly important to achieving desired results in the semiconductor processing industry. Nanofabrication provides greater process control while allowing continued reduction of minimum feature dimensions of structures formed on substrates. Other areas of development in which nanofabrication has been employed include biotechnology, optical technology, mechanical systems, and the like. In some examples, nanofabrication includes fabricating structures on substrates that are assembled to form an optical device.

SUMMARY

The invention involves a realization that improvements in forming spacer layers on substrates can increase an accuracy and a precision and improve a mechanical integrity of such spacer layers while reducing a cost and a complexity associated with producing such spacer layers for stacking optically functional layers in order to clearly see world side objects without affecting an optical clarity of a device including the stacked layers. In this regard, various aspects of disclosed imprint lithography methods can result in spacer layers formed on substrates in a manner that more accurately positions spacers, more precisely sizes spacers with desirable platform areas, improves light visibility through the device including the stacked layers, and improves a mechanical integrity of spacers as compared to spacer layers produced via other techniques. For example, a polymerizable, highly transmissive substance (e.g., greater than 90% transmission of visible light in air) can be accurately dispensed as droplets according to a programmed drop-on-demand mapping scheme along a peripheral edge of a substrate on a same side as which a functional pattern is imprinted without contacting the functional pattern and therefore without interfering with an optical integrity of the functional pattern. In other examples, a polymerizable, highly transmissive substance (e.g., greater than 90% transmission of visible light in air) can be accurately dispensed as droplets across an entire side of a substrate that is opposite a side on which a functional pattern is imprinted to produce desired optical effects or to provide structural support. Such dispensed droplets are highly transmissive upon curing (i.e., polymerizing). Additionally, owing in part to their small size, the droplets are invisible to the naked eye when the device is looked through as intended (e.g., with the device located close to the near point (e.g., 25 mm) of the eye). Furthermore, properties of the polymerizable substance, as well as a precise dispense volume of the polymerizable substance, can yield precisely formed spacers that vary in height by as little as 5% across an area of a substrate. Additionally, an elasticity of such spacers in a cured state provides the spacers with a mechanical integrity that is sufficient for supporting adjoined and adjacent substrates in a manner that prevents bowing or warping along interior regions of the substrates.

One aspect of the invention features an imprint lithography method of configuring an optical layer. The imprint lithography method includes depositing a set of droplets atop a side of a substrate in a manner such that the set of droplets do not contact a functional pattern formed on the substrate. The imprint lithography method further includes curing the set of droplets to form a spacer layer associated with the side of the substrate and of a height selected such that the spacer layer can support a surface adjacent the substrate and spanning the set of droplets at a position spaced apart from the functional pattern.

In some embodiments, each droplet of the set of droplets has a volume of about 1 pL to about 100 pL.

In some embodiments, each droplet of the set of droplet is transparent.

In certain embodiments, the imprint lithography method further includes generating a drop-on demand programming scheme.

In some embodiments, the imprint lithography method further includes providing a printing screen.

In certain embodiments, the imprint lithography method further includes imprinting the functional pattern on the substrate.

In some embodiments, depositing the set of droplets atop the side of the substrate includes dispensing droplet volumes of a polymerizable substance atop the side of the substrate.

In certain embodiments, the set of droplets is a first set of droplets, and the imprint lithography method further includes depositing each drop of the first set of droplets directly on the side of the substrate and curing the first set of droplets directly on the side of the substrate.

In some embodiments, each droplet of the first set of droplets has a cured height of about 0.5 µm to about 20.0 µm.

In certain embodiments, the imprint lithography method further includes, after the first set of droplets is cured depositing a second set of droplets atop the side of the substrate such that each droplet of the second set of droplets is respectively dispensed directly atop a droplet of the first set of droplets and curing the second set of droplets directly atop the first set of droplets to increase a height of the spacer layer.

In some embodiments, a first number of droplets in the first set of droplets is equal to a second number of droplets in the second set of droplets such that the spacer layer has a uniform height.

In certain embodiments, a first number of droplets in the first set of droplets is not equal to a second number of droplets in the second set of droplets such that the spacer layer has a variable height.

In some embodiments, the spacer layer has a wedge shape.

In certain embodiments, the functional pattern is imprinted on the side of the substrate.

In some embodiments, the functional pattern is imprinted along an interior region of the side of the substrate, and the imprint lithography method further includes depositing the set of droplets along a peripheral edge of the side of the substrate.

In certain embodiments, the side of the substrate is a first side of the substrate, and the functional pattern is imprinted on a second side of the substrate that is opposite the first side of the substrate.

In some embodiments, the imprint lithography method further includes depositing the set of droplets across an entirety of the first side of the substrate.

In certain embodiments, the imprint lithography method further includes attaching the substrate to the surface adjacent the substrate at the set of droplets such that the spacer layer forms a gap between the substrate and the surface.

In some embodiments, the gap provides a low index region.

In certain embodiments, the low index region includes air with an index of refraction of 1.

In some embodiments, the method further includes filling the gap with a polymerizable material having an index of refraction in a range of 1.3-1.6.

In certain embodiments, the polymerizable material has an index of refraction that is equal to an index of refraction of the cured set of droplets that forms the spacer layer.

Another aspect of the invention features an optical layer that includes a substrate, a functional pattern formed on the substrate, and a cured set of droplets disposed on a side of the substrate and spaced apart from the functional pattern. The cured set of droplets form a spacer layer associated with the side of the substrate and of a height selected such that the spacer layer can support a surface adjacent the substrate and spanning the cured set of droplets at a position spaced apart from the functional pattern.

In some embodiments, a defined radius of curvature can be imparted to the stacked optical layers by forming spacer layers with drops of pre-defined, varying height. Such drops with varying heights can be formed by dispensing drops of the same material with different volumes, dispensing drops of different material such that the volumes and surface tensions of the individual drops define final end heights of the drops, and dispensing drops of the same material or of different materials atop one another to achieve a desired variation in height. Such drops with varying heights can also be formed using techniques including but not limited to conductive, convective, and/or radiative drop volume evaporation schemes to selectively alter volumes, surface tensions, and surface energies of the dispensed drops to affect heights of the drops upon curing.

The details of one or more embodiments of the invention are set forth in the accompanying drawings and the description below. Other features, aspects, and advantages of the invention will be apparent from the description, the drawings, and the claims.

BRIEF DESCRIPTION OF THE DRAWINGS

Like reference symbols in the various figures indicate like elements.

Figure 1:
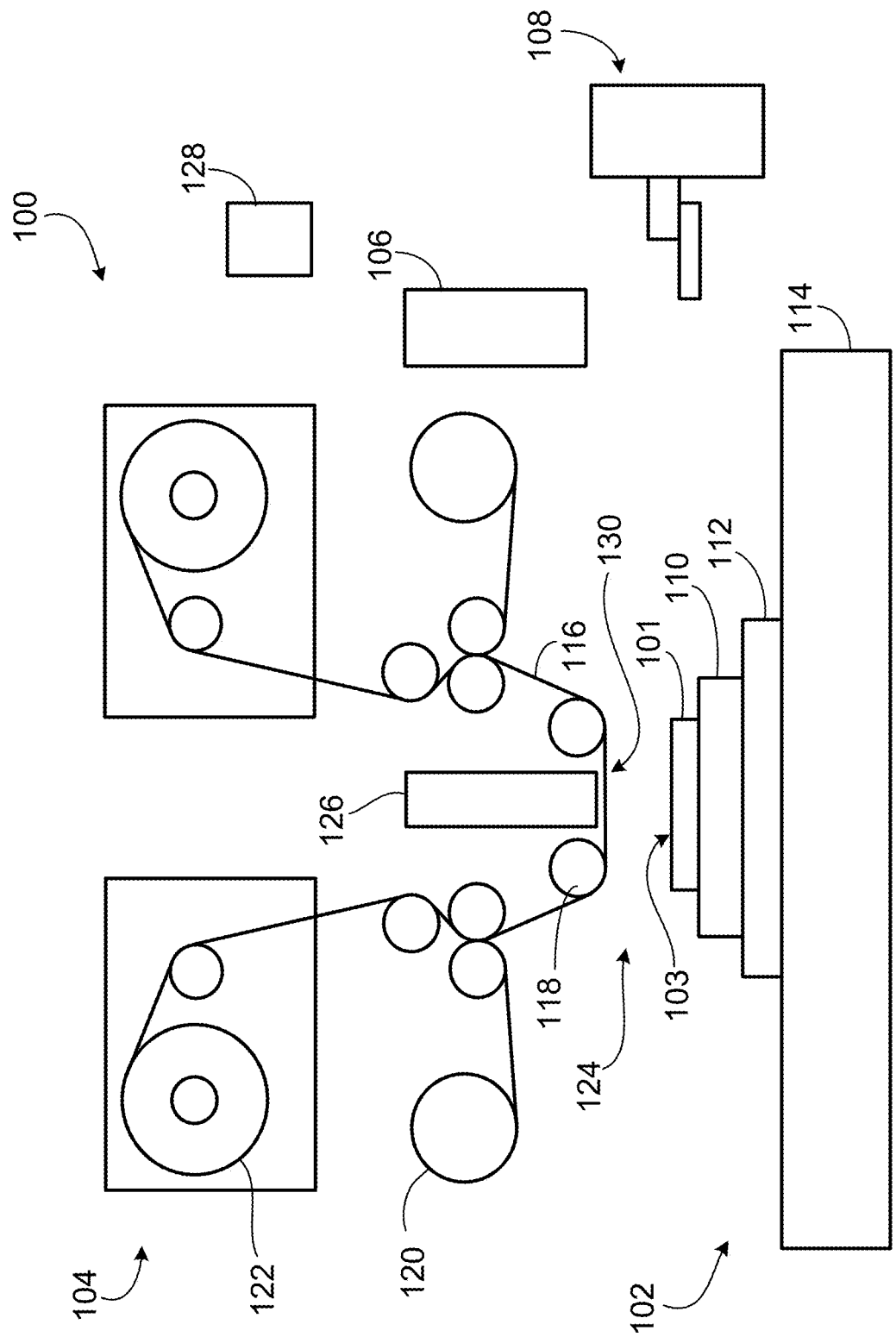
FIG. 1 is a diagram of an imprint lithography system.

In some examples, illustrations shown in the drawings may not be drawn to scale.

DETAILED DESCRIPTION

An imprint lithography process for configuring an optical layer is described below. The imprint lithography process involves forming spacer layers on substrates. Such a process can increase an accuracy and a precision and improve a mechanical integrity of such spacer layers while reducing a cost and a complexity associated with producing such spacer layers for creating multi-layer optical devices.

FIG. 1 illustrates an imprint lithography system 100 that is operable to form a relief pattern on a top surface 103 of a substrate 101 (e.g., a wafer). The imprint lithography system 100 includes a support assembly 102 that supports and transports the substrate 101, an imprinting assembly 104 that forms the relief pattern on the top surface 103 of the substrate 101, a fluid dispenser 106 that deposits a polymerizable substance upon the top surface 103 of the substrate 101, and a robot 108 that places the substrate 101 on the support assembly 102. The imprint lithography system 100 also includes one or more processors 128 that can operate on a computer readable program stored in memory and that are in communication with and programmed to control the support assembly 102, the imprinting assembly 104, the fluid dispenser 106, and the robot 108.

The substrate 101 is a substantially planar, thin slice that is typically made of one or more materials including silicon, silicon dioxide, aluminum oxide, sapphire, germanium, gallium arsenide (GaAs), an alloy of silicon and germanium, indium phosphide (InP), or other example materials. The substrate 101 typically has a substantially circular or rectangular shape. The substrate 101 typically has a diameter in a range of about 50 mm to about 200 mm (e.g., about 65 mm, about 150 mm, or about 200 mm) or a length and a width in a range of about 50 mm to about 200 mm (e.g., about 65 mm, about 150 mm, or about 200 mm). The substrate 101 typically has and a thickness in a range of about 0.2 mm to about 1.0 mm. The thickness of the substrate 101 is substantially uniform (e.g., constant) across the substrate 101. The relief pattern is formed as a set of structural features (e.g., protrusions and recesses) in the polymerizable substance upon the top surface 103 of the substrate 101, as will be discussed in more detail below.

The support assembly 102 includes a chuck 110 that supports and secures the substrate 101, an air bearing 112 that supports the chuck 110, and a base 114 that supports the air bearing 112. The base 114 is located in a fixed position, while the air bearing 112 can move in up to three directions (e.g., x, y, and z directions) to transport the chuck 110 (e.g., in some instances, carrying the substrate 101) to and from the robot 108, the fluid dispenser 106, and the imprinting assembly 104. In some embodiments, the chuck 110 is a vacuum chuck, a pin-type chuck, a groove-type chuck, an electromagnetic chuck, or another type of chuck.

Still referring to FIG. 1, the imprinting assembly 104 includes a flexible template 116 with a patterning surface defining an original pattern from which the relief pattern is formed complementarily on the top surface 103 of the substrate 101. Accordingly, the patterning surface of the flexible template 116 includes structural features, such as protrusions and recesses. The imprinting assembly 104 also includes multiple rollers 118, 120, 122 of various diameters that rotate to allow one or more portions of the flexible template 116 to be moved in the x direction within a processing region 130 of the imprint lithography system 100 to cause a selected portion of the flexible template 116 to be aligned (e.g., superimposed) with the substrate 101 along the processing region 130. One or more of the rollers 118, 120, 122 are individually or together moveable in the vertical direction (e.g., the z direction) to vary a vertical position of the flexible template 116 in the processing region 130 of the imprinting assembly 104. Accordingly, the flexible template 116 can push down on the substrate 101 in the processing region 130 to form an imprint atop the substrate 101. An arrangement and a number of the rollers 118, 120, 122 can vary, depending upon various design parameters of the imprint lithography system 100. In some embodiments, the flexible template 116 is coupled to (e.g., supported or secured by) a vacuum chuck, a pin-type chuck, a groove-type chuck, an electromagnetic chuck, or another type of chuck.

In operation of the imprint lithography system 100, the flexible template 116 and the substrate 101 are aligned in desired vertical and lateral positions by the rollers 118, 120, 122 and the air bearing 112, respectively. Such positioning defines a volume 124 within the processing region 130 between the flexible template 116 and the substrate 101. The volume 124 can be filled by the polymerizable substance once the polymerizable substance is deposited upon the top surface 103 of the substrate 101 by the fluid dispenser 106, and the chuck 110 (e.g., carrying the substrate 101) is subsequently moved to the processing region 130 by the air bearing 112.

Accordingly, both the flexible template 116 and the top surface 103 of the substrate 101 can be in contact with the polymerizable substance in the processing region 130 of the imprint lithography system 100. Example polymerizable substances may be formulated from one or more substances, such as isobornyl acrylate, n-hexyl acrylate, ethylene glycol diacrylate, 2-hydroxy-2-methyl-1-phenyl-propan-1-one, (2-Methyl-2-Ethyl-1,3-dioxolane-4-yl)methyl acrylate, hexanediol diacrylate, 2-methyl-1-[4-(methylthio)phenyl]-2-(4-morpholinyl)-1-propanone, diphenyl (2,4,6-trimethylbenzoyl)-phosphine oxide, 2-hydroxy-2-methyl-1-phenyl-1-propanone, and various surfactants. Example techniques by which the polymerizable substance may be deposited atop the substrate 101 by the fluid dispenser 106 include drop dispense, spin-coating, dip coating, chemical vapor deposition (CVD), physical vapor deposition (PVD), thin film deposition, thick film deposition, and other techniques. In some examples, the polymerizable substance is deposited atop the substrate 101 in multiple droplets.

The printing system 104 includes an energy source 126 that directs energy (e.g., broadband ultraviolet radiation) towards the polymerizable substance atop the substrate 101 within the processing region 130. Energy emitted from the energy source 126 causes the polymerizable substance to solidify and/or cross-link, thereby resulting in a patterned layer that conforms to a shape of the portion of the flexible template 116 in contact with the polymerizable substance in the processing region 130.

Figure 2:
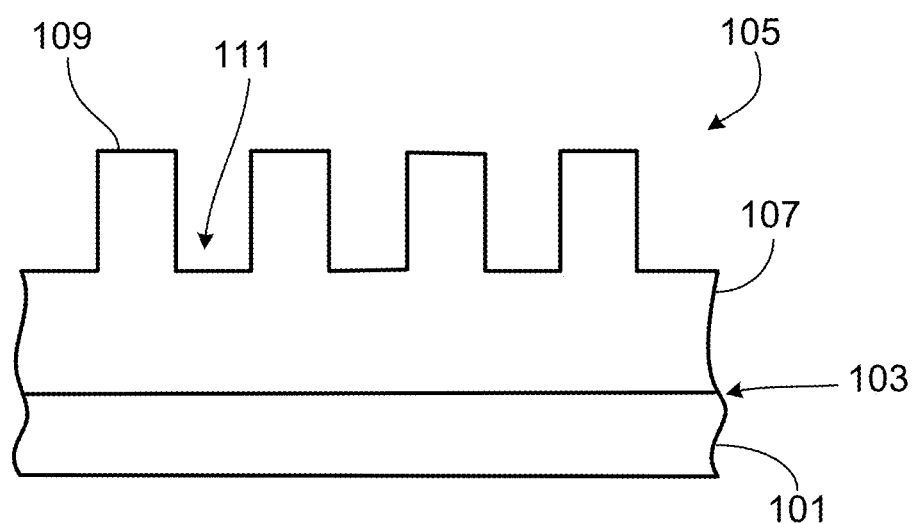
FIG. 2 is diagram of patterned layer formed by the imprint lithography system of FIG. 1.

FIG. 2 illustrates an example patterned layer 105 formed on the substrate 101 by the imprint lithography system 100. The patterned layer 105 includes a residual layer 107 and multiple features including protrusions 109 extending from the residual layer 107 and recessions 111 formed by adjacent protrusions 109 and the residual layer 107.

While the imprint lithography system 100 is described and illustrated as a roll-to-plate or plate-to-roll system, imprint lithography systems of different configurations can also be used to produce the example patterned layer 105 and the example patterns discussed below. Such imprint lithography systems may have a roll-to-roll or a plate-to-plate configuration.

Figure 3:
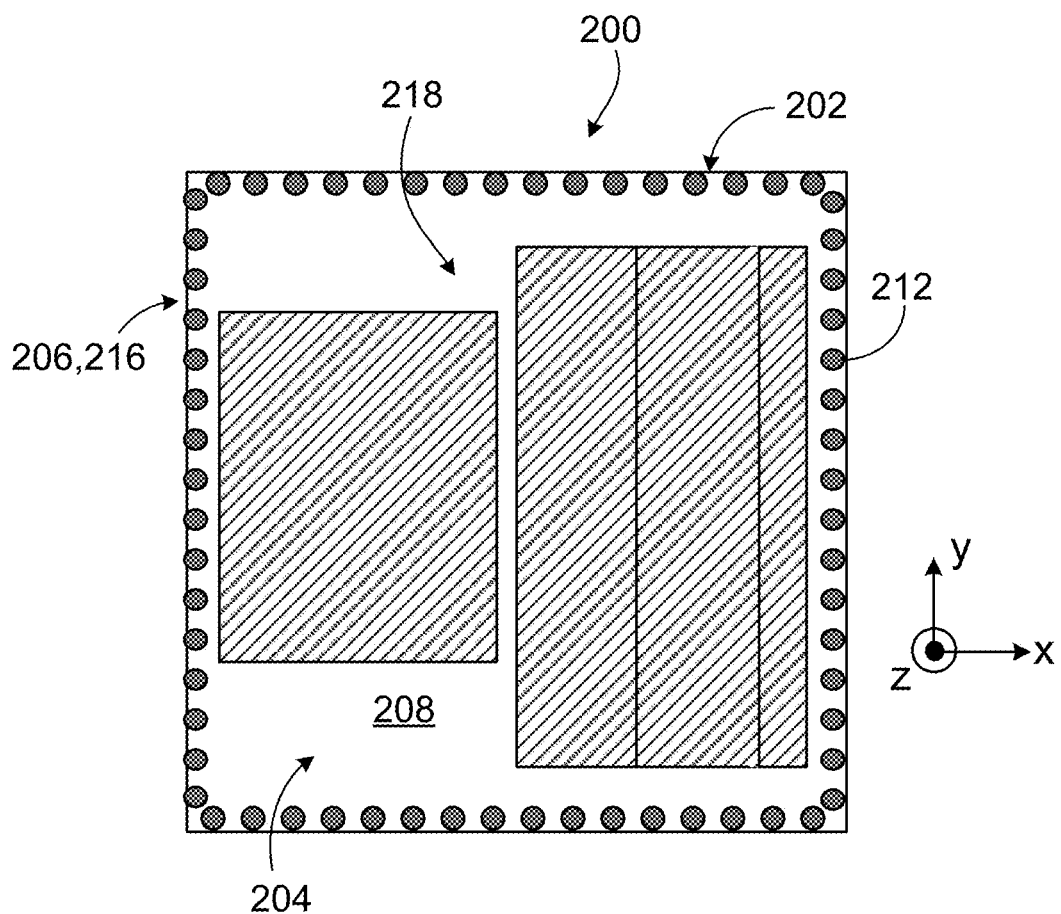
FIG. 3 is a top view of an optical layer.
Figure 4:
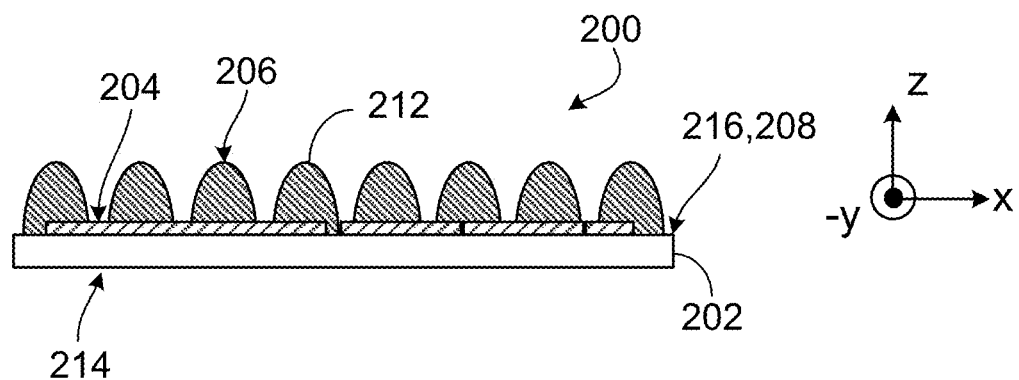
FIG. 4 is a side view of the optical layer of FIG. 3.

In some embodiments, a substrate (e.g., the substrate 101 of the imprint lithography system 100) is processed (e.g., imprinted on one or both sides, supplied with additional features (e.g., spacer components), and/or cut out to shape) to form an optical layer of a multi-layer optical device (e.g., a wearable eyepiece, an optical sensor, or an optical film, such as that used in a display). For example, FIGS. 3 and 4 illustrate a top view and a side view, respectively, of an optical layer 200 that includes a substrate 202, a functional pattern 204 imprinted atop the substrate 202, and a spacer layer 206 deposited atop the substrate 202. The substrate 202 may be laser cut from a larger substrate (e.g., the substrate 101) and is provided as a layer of transparent or semi-transparent plastic (e.g., a flexible material) or glass (e.g., a rigid material) that is made of one or more organic or inorganic materials, in accordance with the various material formulations described above with respect to the substrate 101. The substrate 202 may have a length of about 10 mm to about 150 mm (e.g., about 50 mm), a width of about 10 mm to about 150 mm (e.g., about 50 mm), and a thickness of about 0.1 mm to about 10.0 mm (e.g., about 0.5 mm). The substrate 202 has a relatively high refractive index in a range of about 1.6 to about 1.9 and a Transmissivity in a range of about 80% to about 95%.

The functional pattern 204 is imprinted atop an upper side 208 of the substrate 202 and is located along an interior region 218 with respect to a peripheral edge 216 of the substrate 202. The functional pattern 204 is a waveguide pattern formed of multiple diffraction gratings that provide a basic working functionality of the optical layer 200. The diffraction gratings have dimensions in a range of about 10 nm to about 500 nm. The diffraction gratings are configured to project light of wavelengths within a particular range and to focus a virtual image at a particular depth plane. The focused light, together with focused light projected through proximal optical layers, forms a multi-color virtual image over one or more depth planes. The projected light may be red light with wavelengths in a range of about 560 nm to about 640 nm, green light with wavelengths in a range of about 490 nm to about 570 nm, or blue light with wavelengths in a range of about 390 nm to about 470 nm. The diffraction gratings can include multiple combinations and arrangements of protrusions and recessions (e.g., such as the protrusions 109 and the recessions 111) that together provide desired optical effects. The diffraction gratings include in-coupling gratings and form an orthogonal pupil expander region and an exit pupil expander region. The functional pattern 204 may have a total length of about 10 mm to about 150 mm and a total width of about 10 mm to about 150 mm.

The spacer layer 206 is a layer that has been dispensed atop the upper side 208 of the substrate 202 according to a drop-on-demand mapping scheme after the functional pattern 204 has been imprinted atop the upper side 208 of the substrate 202. For example, the spacer layer 206 may be deposited atop the substrate 202 with the fluid dispenser 106, as controlled by the processor 128 of the imprint lithography system 100 according to a drop-on-demand mapping scheme stored in memory. In some implementations, dispensing of the spacers 212 via such techniques is nearly invisible to the naked eye. The spacer layer 206 is disposed along the peripheral edge 216 of the substrate and surrounds the functional pattern 204 so as not to interfere with an optical performance of the functional pattern 204. The spacer layer 206 includes multiple spacers 212 that are sized (e.g., in height) to produce a gap (e.g., a layer of air) between the optical layer 200 and an adjacent optical layer that together form a part of a multi-layer stacked optical device when the two optical layers are adhered to one another, as will be discussed in more detail below with respect to FIGS. 7 and 10. The spacers 212 are arranged along the peripheral edge 216 to provide structural support for the substrate 202 and for an adjacent optical layer that is in contact with the spacers 212.

The spacers 212 are dispensed as a drop or as a series of multiple drops (e.g., up to about 5 drops) of a polymerizable substance that spreads to achieve a generally hemispherical shape (e.g., a dome shape) atop the substrate 202. Accordingly, the spacers 212 have an xy cross-sectional shape that is generally circular or elliptical. Example polymerizable substances used to produce the spacers 212 include acrylates and epoxies, in addition to the various polymerizable substances discussed above with respect to the imprint lithography system 100. Such polymerizable substances are re-workable in the presence of heat, upon exposure to a solvent, or using other techniques such that the spacers 212 can delaminate from the substrate 202 so that the optical layer 200 can be removed, replaced, or realigned if desired.

The spacers 212 are transparent or semi-transparent and occupy very small areas on the substrate 202. For example, the spacers 212 may have a maximum diameter or width (e.g., at a base of a spacer 212 in contact with the substrate 202) in a range of about 5 µm to about 1000 µm and a height in a range of about 0.5 µm to about 100.0 µm. In some examples, the spacers 212 can be produced according to the implementations disclosed herein with a good precision such that heights of the spacers 212 located across the substrate 202 have a variation of as little as 5%. Each spacer 212 may be located about 5 µm to about 50,000 µm from another adjacent spacer 212 or from the functional pattern 204. In some embodiments, the spacers 212 (e.g., in a cured state) have a modulus of elasticity that is greater than 1 GPa (e.g., in a range of about 0.1 GPa to about 5.0 GPa).

Figure 5:
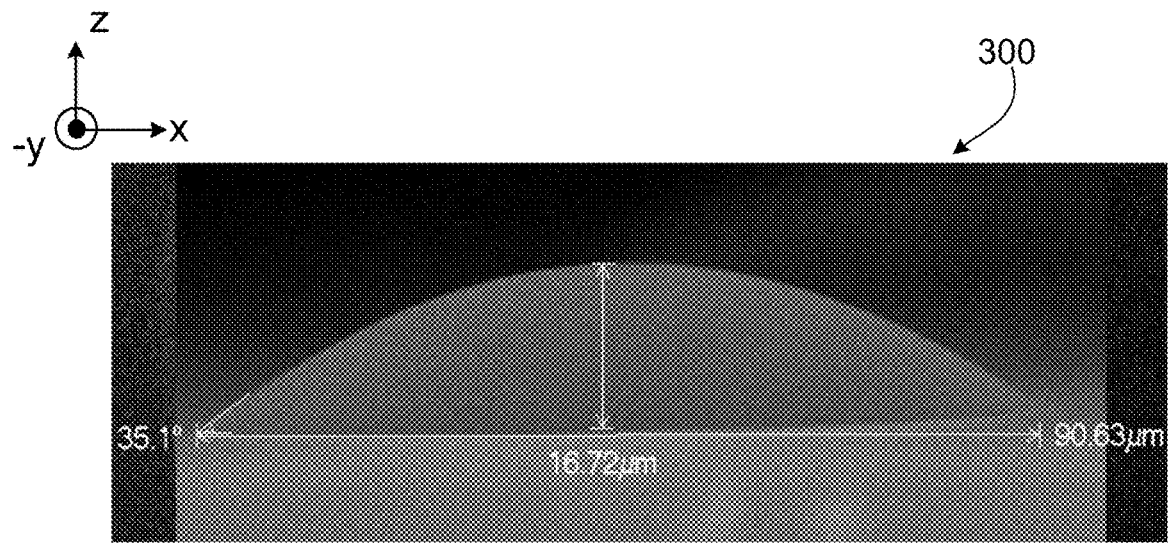
FIG. 5 is an SEM image of a side view of a spacer.

As discussed above, a spacer 212 can be formed from a series of multiple drops dispensed atop one another. For example, FIG. 5 is a scanning electron microscopy (SEM) image of a side view of an example spacer 300 that is formed from two dispensed drops that are cured serially. Each drop has a dispense volume of about 1 pL to about 100 pL (e.g., about 5 pL). The polymerizable substance from which the drop is formed may have a viscosity in a range of about 0.5 cP to about 500.0 cP. A substance with a relatively low viscosity will result in drops that tend to spread upon contacting the substrate 202 to form an ellipsoid hemispherical shape (e.g., with a width that is larger than a height) with a desirable contact angle, as shown in FIG. 5. For example, the spacer 300 has a contact angle of about 35.1°. Additionally, higher viscosity fluids that are thixotropic or shear-thinning can be used to produce the spacers described herein. Such fluids have reduced viscosity when a force is applied to them (e.g., via a piezoelectric element in a fluid dispenser), but do not move once in contact with a substrate. In other examples, a substance with a relatively high surface tension will only minimally spread upon contacting a substrate 202 that has a relatively low surface energy and thus form drops atop the substrate 202 that are generally more hemispherical in shape with a relatively high contact angle. On the other hand, a substance with a relatively low surface tension will spread more extensively upon contacting a substrate 202 that has a relatively high surface energy and thus form drops atop the substrate 202 that are generally more ellipsoidal hemispherical in shape with a relatively low contact angle.

To form the spacer 300, a first drop can be dispensed and allowed to cure. A curing cycle may last about 1 s to about 100 s, depending on an irradiance energy and a photo-reactivity or stability of the material. The first, single dispensed drop spreads to form the hemispherical shape and has a height (e.g., a cured height) of about 0.5 µm to about 20.0 µm (e.g., about 3.0 µm) and a width (e.g., a cured width) of about 5 µm to about 200 µm (e.g., about 50 µm), depending on a viscosity of the polymerizable substance (e.g., depending on a degree to which the drop spreads upon contacting the substrate 202). Once the first drop has cured, a second drop can be dispensed atop the first drop and allowed to cure. Upon contacting the first drop, the second drop spreads across the surface of the first drop, thereby increasing the height of the spacer 300 to about 1.0 µm to about 40.0 µm (e.g., about 16.7 µm) and increasing the width of the spacer 300 to about 10.0 µm to about 400.0 µm (e.g., about 90.6 µm). In general, each sequentially deposited drop may increase the height of a hemispherical spacer by about 0.5 µm to about 20.0 µm and increase the width of a hemispherical spacer by about 5 µm to about 200 µm. Generally, a shape of a spacer becomes more spherical and less hemispherical as a contact angle at which the drop is dispensed atop a substrate increases. Conversely, the shape of the spacer becomes more hemispherical and less spherical as the contact angle at which the drop is dispensed atop the substrate decreases.

Figure 6:
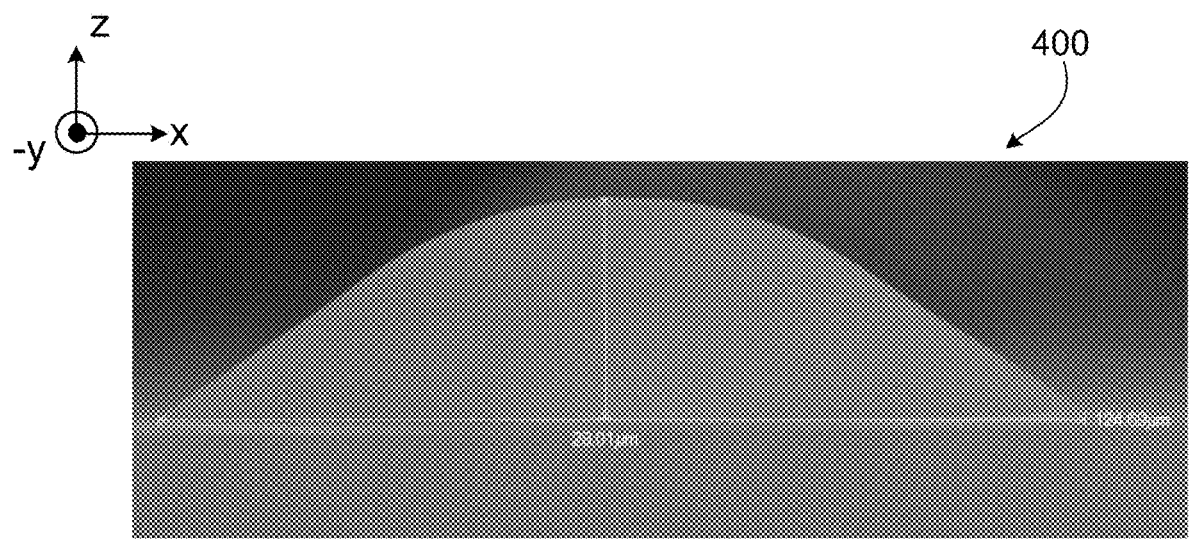
FIG. 6 is an SEM image of a side view of a spacer.

FIG. 6 is an SEM image of a side view of an example spacer 400 that is formed from five dispensed drops that are cured serially. The spacer 400 may be produced as described above with respect to the spacer 300. A larger number of drops provides the ellipsoidal hemispherical shape profile of the spacer 400 with different radii of curvature as compared to those of the spacer 300. For example, in some instances, the spacer 400 includes an upper portion with a radius of curvature that is lower than a radius of curvature of a lower portion of the spacer 400.

The spacer 400 has a height of about 1 μm to about 100 μm (e.g., about 28 μm) and a width of about 10 μm to about 1000 μm (e.g., about 125 μm).

Figure 7:
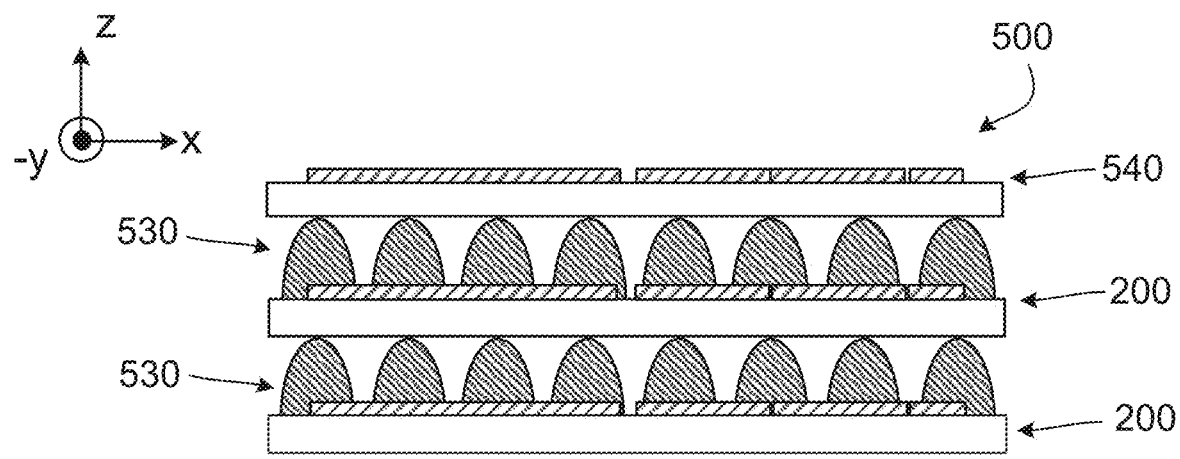
FIG. 7 is a side view of a portion of an optical device that includes the optical layer of FIG. 3.

FIG. 7 illustrates a side view of a portion of an optical device 500 (e.g., a wearable eyepiece) that includes multiple optical layers, including two of the example optical layers 200, as well as an example optical layer 540 that includes the substrate 202 and the functional pattern 204. The optical device 500 also includes additional optical layers that are not shown. The optical device 500 is formed by aligning the optical layers 200, 540 with one another and adhering the optical layers 200, 540 to one another with adhesive drops dispensed atop the spacers 212 of the spacer layer 206. In some embodiments, adjacent optical layers 200, 540 are alternatively or additionally adhered to one another with uncured or partially cured drops dispensed atop the cured spacers 212. Such uncured or partially cured drops can act as binders that, once cured, securely join adjacent optical layers 200, 540. The uncured or partially cured drops may be of the same substance that forms the spacers 212. In addition to the adhesive and/or the uncured or partially cured drops, the optical layers 200, 540 are subsequently further adhered to each other with a seal (e.g., a peripheral or edge seal) that serves as an attachment mechanism to which all of the peripheral edges 216 of the optical layers 200, 540 are joined. The optical device 500 can include multiple of the optical layers 200 and other optical layers, and can include from 3 to 20 optical layers in total.

Each spacer layer 206 of the optical device 500 creates a gap 530 defining a layer of air between adjacent optical layers 200, 540. The layers of air defined by the spacer layers 206 have a low index of refraction in a range of about 1.0 to about 1.2. The low index layers of air, alternating with the high index optical layers 200, 540 enhance 3D visualization and reduce or eliminate coupling of light between adjacent optical layers 200, 540. The support structure formed by the arrangement of spacers 212 of a spacer layer 206 supports the substrate 202 to which the spacers 212 are attached and the adjacent substrate 202 in a way that prevents or reduces warping of the substrates 202 that may otherwise occur if the optical layers 200, 540 were to be adhered via a different technique, such as dispensing drops of glue within interior portions or along the peripheral edges 216 of the substrates 202.

Figure 8:
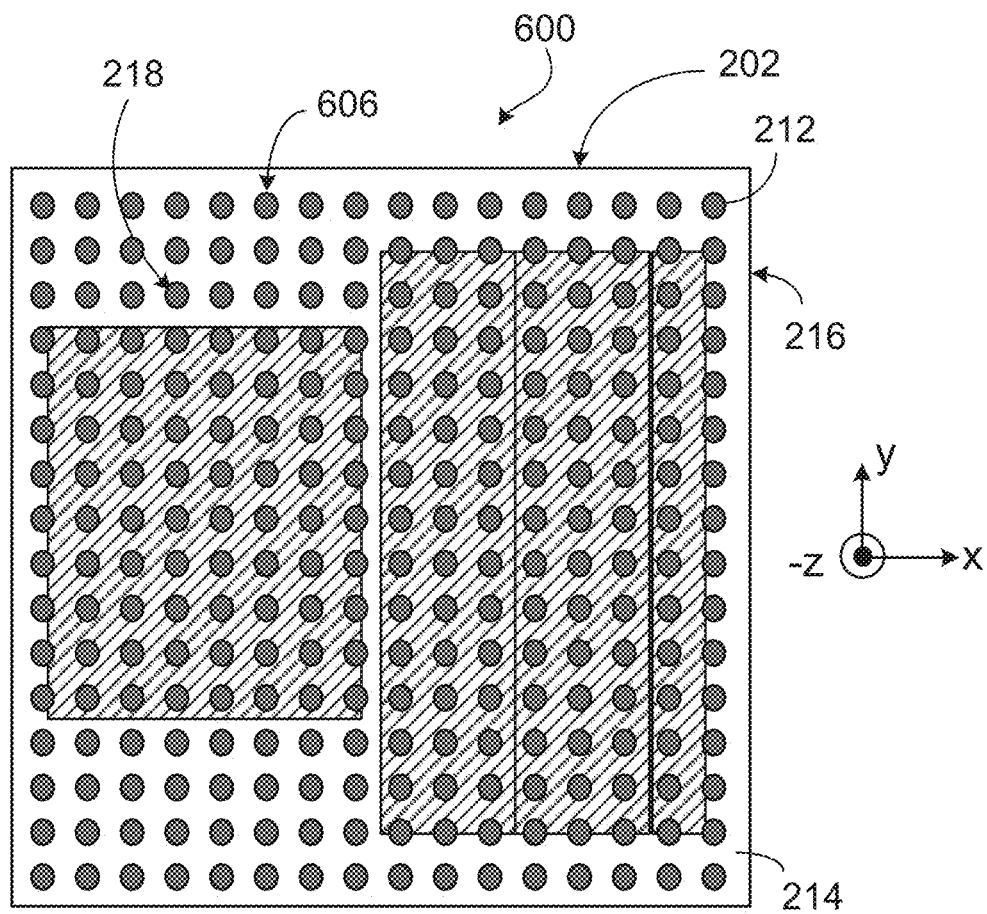
FIG. 8 is a bottom view of an optical layer with a configuration that is different from the configuration of the optical layer shown in FIG. 3.
Figure 9:
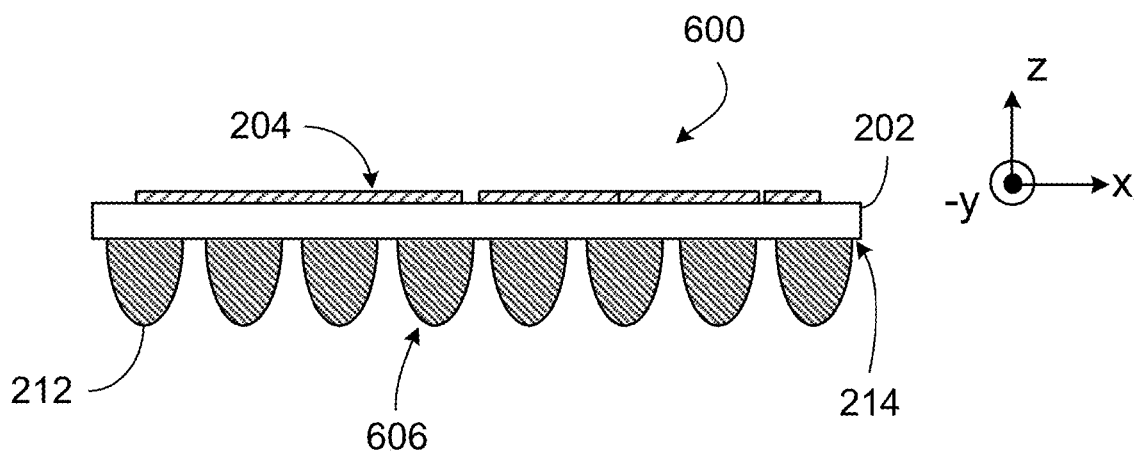
FIG. 9 is a side view of the optical layer of FIG. 8.

Other arrangements of spacer layers and/or functional patterns are possible. For example, FIGS. 8 and 9 illustrate a bottom view and a side view, respectively, of an optical layer 600 that includes the substrate 202 and the functional pattern 204 of the optical layer 200, as well as a spacer layer 606. The functional pattern 204 is imprinted on the upper layer 208 of the substrate 202, as in the optical layer 200. The spacer layer 606 is substantially similar in construction and function to the spacer layer 206, except that the spacer layer 606 is deposited on a lower side 214 of the substrate 202, and an arrangement of the spacers 212 of the spacer layer 606 extends along the peripheral edge 216 of the substrate 202, as well as across the interior region 218 of the substrate 202. The spacer layer 606 is dispensed atop the lower side 214 of the substrate after the functional pattern 204 has been imprinted atop the upper side 208 of the substrate. Because the spacer layer 606 and the functional pattern 204 are disposed on different (e.g., opposite) sides of the substrate 202, the spacer layer 606 does not interfere with an optical performance of the functional pattern 204.

While the optical layers 200, 600 have been described and illustrated as including a spacer layer 206, 606 on one side of the substrate 202, in some examples, a spacer layer can be formed on both sides of a substrate. For example, an optical layer may include the substrate 202, the spacer layer 206 dispensed on the upper side 208 of the substrate 202, and the spacer layer 306 dispensed on the lower side 214 of the substrate 202.

While the optical layers 200, 600 have been described and illustrated as including spacer layers that do not contact the functional pattern 204, in some examples, a spacer layer can be formed directly atop a functional pattern to produce certain optical effects, such as to enhance constructive interference and mitigate destructive interference of diffracted light.

Figure 10:
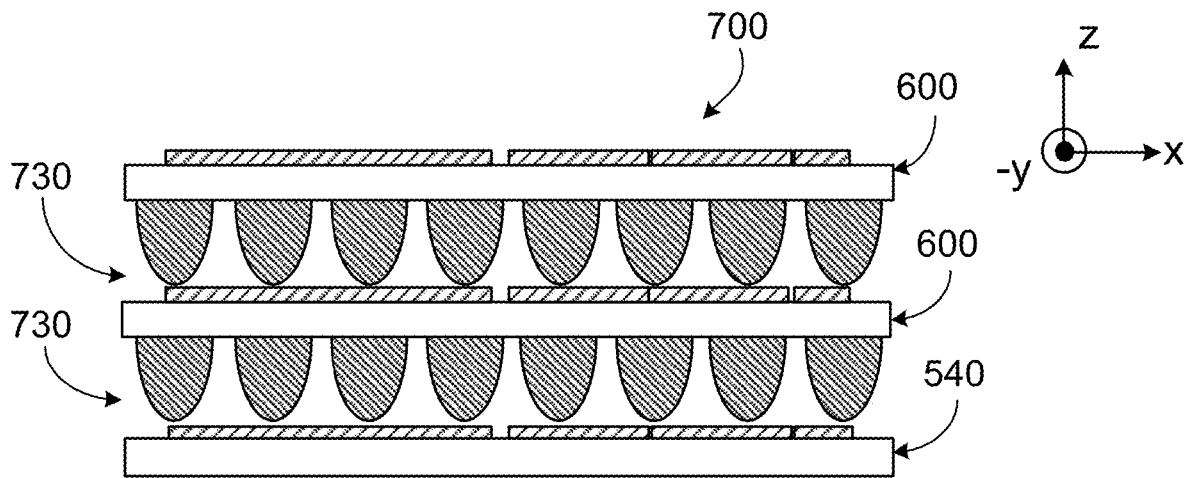
FIG. 10 is a side view of a portion of an optical device that includes the optical layer of FIG. 8.

FIG. 10 illustrates a side view of a portion of an optical device 700 (e.g., a wearable eyepiece) that includes multiple optical layers, including two of the example optical layers 600, as well as then example optical layer 540 of the optical device 500. The optical device 700 also includes additional optical layers that are not shown. The optical device 700 is formed by aligning the optical layers 600, 540 with one another, by adhering the optical layers 600, 540 to one another with adhesive drops dispensed atop the spacers 212 of the spacer layer 606 or alternatively or additionally with uncured or partially cured drops dispensed atop the cured spacers 212, and by further attaching the optical layers to a peripheral or edge seal, as discussed above with respect to the optical device 500. The optical device 700 can include multiple of the optical layers 600 and other optical layers, and can include from 3 to 20 optical layers in total.

Each spacer layer 606 of the optical device 700 creates a gap 730 defining a layer of air between adjacent optical layers 600, 540. The layers of air defined by the spacer layers 606 have a low index of refraction in a range of about 1.0 to about 1.2. The low index layers of air, alternating with the high index optical layers 600, 540 enhance 3D visualization and reduce or eliminate coupling of light between adjacent optical layers 600, 540. The support structure formed by the arrangement of spacers 212 of a spacer layer 606 supports the substrate 202 on which the spacers 212 are imprinted and the adjacent substrate 202 in a way that prevents or reduces warping of the substrates 202 that may otherwise occur if the optical layers 600, 540 were to be adhered via a different technique, such as dispensing drops of glue within interior portions or along the peripheral edges 216 of the substrates 202.

In the example of FIG. 10, the spacers 212 (e.g., the spacer layer 606 in a cured state) arranged on one side of a first substrate 202 can contact a functional pattern 204 imprinted on one side of an adjacent substrate 540 without interfering with an optical performance of the adjacent substrate 540. In some examples, such a configuration is selected for one or more intentional, desired optical effects of nearby functional patterns 204, such as to enhance constructive interference and to mitigate destructive interference of diffracted light. Such optical effects may be produced or enhanced with respect to the functional pattern 204 imprinted on the adjacent substrate and in contact with the spacer layer 606 or with respect to the functional pattern 204 imprinted on an opposite side of the substrate 202 on which the spacer layer 606 is disposed.

In some embodiments, a defined radius of curvature can be imparted to the stacked optical layers by forming spacer layers with drops of pre-defined, varying height. Such drops with varying heights can be formed by dispensing drops of the same material with different volumes, dispensing drops of different material such that the volumes and surface tensions of the individual drops define final end heights of the drops, and dispensing drops of the same material or of different materials atop one another to achieve a desired variation in height. Such drops with varying heights can also be formed using techniques including but not limited to conductive, convective, and/or radiative drop volume evaporation schemes to selectively alter volumes, surface tensions, and surface energies of the dispensed drops to affect heights of the drops upon curing.

Figure 11:
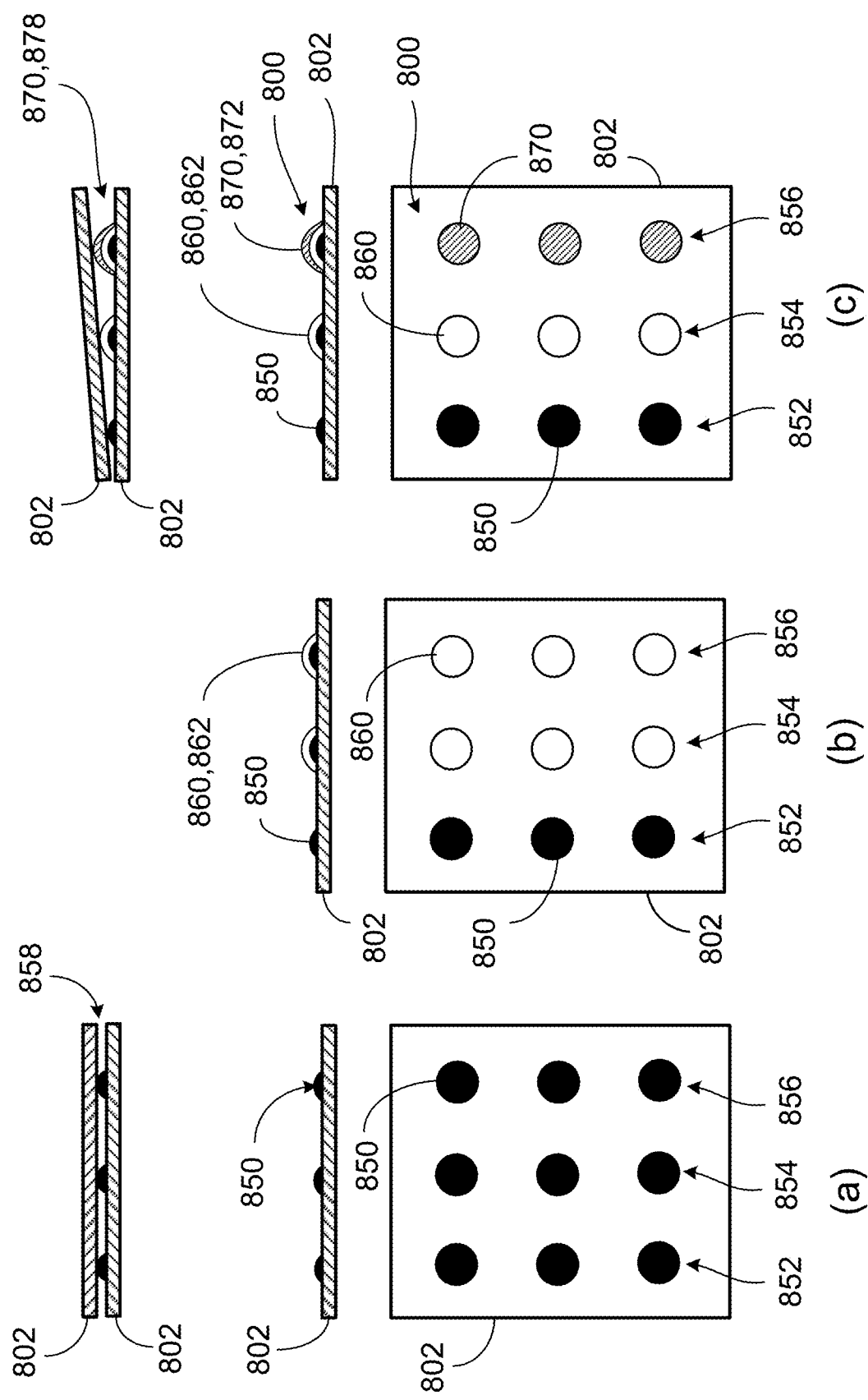
FIG. 11 is a diagram illustrating a series of steps for producing a spacer layer of variable thickness via a drop-on demand programming scheme.

In some embodiments, spacers of variable height may be formed on a substrate to vary a thickness of a gap defined by the spacers across a side of a substrate, such that the spacer layer has a non-symmetric shape (e.g., a wedge shape, a crescent shape, etc.). Such a variable gap thickness may be desirable in situations where nearby layers in an optical stack act as outside light reflectors. To reduce unwanted reflected images in a user's field of view, there may be a need to change a gap thickness, and thus, a plane of reflection for such reflecting layers. For example, FIG. 11 illustrates top views and corresponding side cross-sectional views that portray a series of steps for producing a spacer layer 800 of a variable thickness (e.g., a spacer layer with a wedge shape).

In a first step (a) for producing the spacer layer 800, a first set of drops 850 is dispensed according to a drop-on-demand mapping scheme atop a substrate 802 and allowed to cure. The first set of drops 850 is arranged in three rows 852, 854, 856 of three, single drops 850 and defines a gap 858 of uniform thickness between adjacent substrates 802. The gap 858 may have a thickness of about 0.5 µm to about 100.0 µm (e.g., about 20.0 µm). In a next step (b) for producing the spacer layer 800, a second set of drops 860 is dispensed atop the substrate 802 and allowed to cure. The second set of drops 860 are respectively deposited atop the drops 850 arranged in the rows 854, 856. Accordingly, spacers 862 (formed from drops 850 and drops 860) have a greater height and a greater width as compared to the drops 850. In a next step (c) for producing the spacer layer 800, a third set of drops 870 is dispensed atop the substrate 802 and allowed to cure. The third set of drops 870 are respectively deposited atop the drops 860 arranged in the row 856 to produce a gap 878 of variable thickness (e.g., forming a gap with a significant wedge shape) between adjacent substrates 802. Accordingly, spacers 872 (formed from drops 850, drops 860, and drops 870) have a greater height and a greater width as compared to the drops 860. The gap 878 may have a minimum thickness (e.g., defined by the drops 850) equal to that of the thickness of the gap 858. The gap 878 may have a maximum thickness (e.g., defined by the drops 870 atop the drops 860 and the drops 850) about 1 µm to about 100 µm (e.g., about 40 µm).

Figure 12:
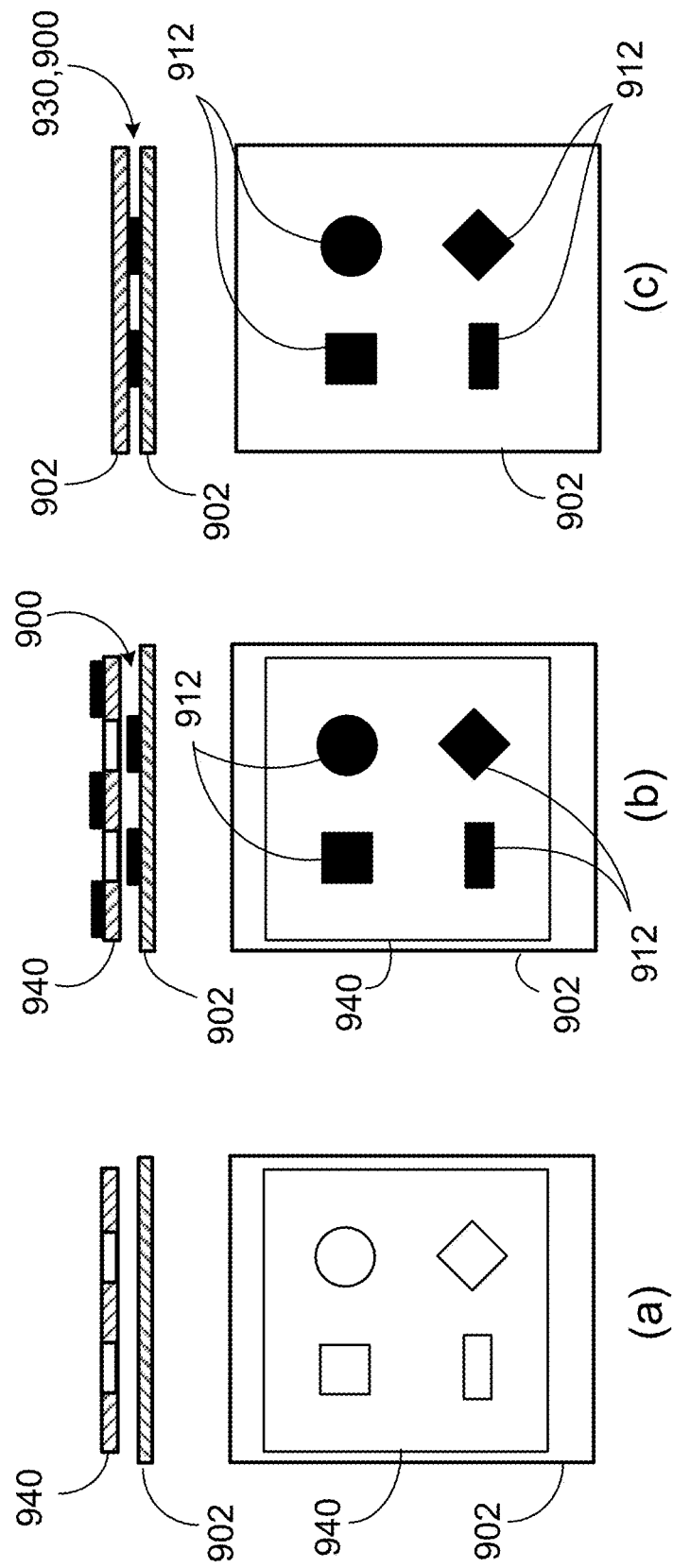
FIG. 12 is a diagram illustrating a series of steps for producing a spacer layer of uniform thickness via a screen printing process.

In some embodiments, spacer layers may be formed via techniques other than drop-on-demand dispensing. For example, FIG. 12 illustrates top views and corresponding side cross-sectional views that portray a series of steps for producing a spacer layer 900 via a screen printing technique. In a first step (a) for producing the spacer layer 900, a screen 940 is positioned above and aligned (e.g., centrally aligned or otherwise aligned) with a substrate 902. The screen 940 defines four cutouts that form a pattern with four different shapes (e.g., one circle and three different quadrilaterals). The screen 940 may be positioned about 0.05 mm to about 10.00 mm (e.g., about 0.50 mm) above the substrate 940. In a next step (b) for producing the spacer layer 900, a polymerizable substance is deposited across a top surface of the screen 940 such that the polymerizable substance passes through the cutouts and deposits atop the substrate 902 according to the pattern of the screen 940 to form spacers 912. In a next step (c) for producing the spacer layer 900, the screen 940 is moved away from the substrate 902 to expose the deposited substance to an energy source (e.g., the energy source 126) to cure the spacers 912. The cured spacers 912 form the spacer layer 900, which defines a gap 930 between two adjacent substrates 902. The cutouts in the screen 940 may be located and the screen 940 may be aligned with the substrate 902 in a manner such that the polymerizable substance is not deposited directly atop a functional pattern disposed on the substrate 902.

Figure 13:
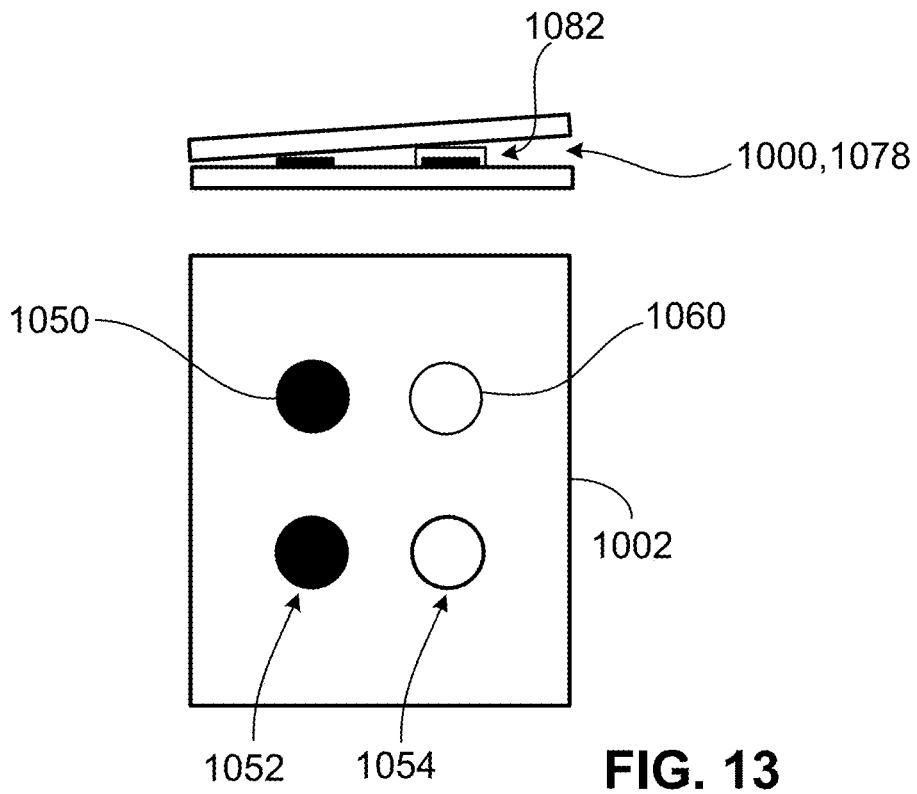
FIG. 13 is a top view and a side cross-sectional view of a spacer layer of variable thickness produced via a screen printing process.

In another example, FIG. 13 illustrates a top view and a corresponding side cross-sectional view of a spacer layer 1000 of a variable thickness (e.g., with a wedge shape) produced via a screen printing process. The spacer layer 1000 is formed atop a substrate 1002 from a first set of substance deposits 1050 and a second set of substance deposits 1060 passed through a screen (not shown). The first set of substance deposits 1050 is arranged in a first row 1052 and in a second row 1054 of two substance deposits 1050 per row. The first set of substance deposits 1050 are allowed to cure prior to the second set of substance deposits 1060 being applied to the substrate 1002. The second set of substance deposits 1060 is arranged in the second row 1054 atop the substance deposits 1050, thereby forming spacers 1082 that each include a substance deposit 1050 and a substance deposit 1060. The spacers 1082 are taller than the first set of substance deposits 1050 arranged in the first row 1052, such that the spacer layer 1000 defines a gap 1078 of variable thickness. The deposits 1050 and the spacers 1082 may not overlay a functional pattern disposed on the substrate 1002.

Figure 14:
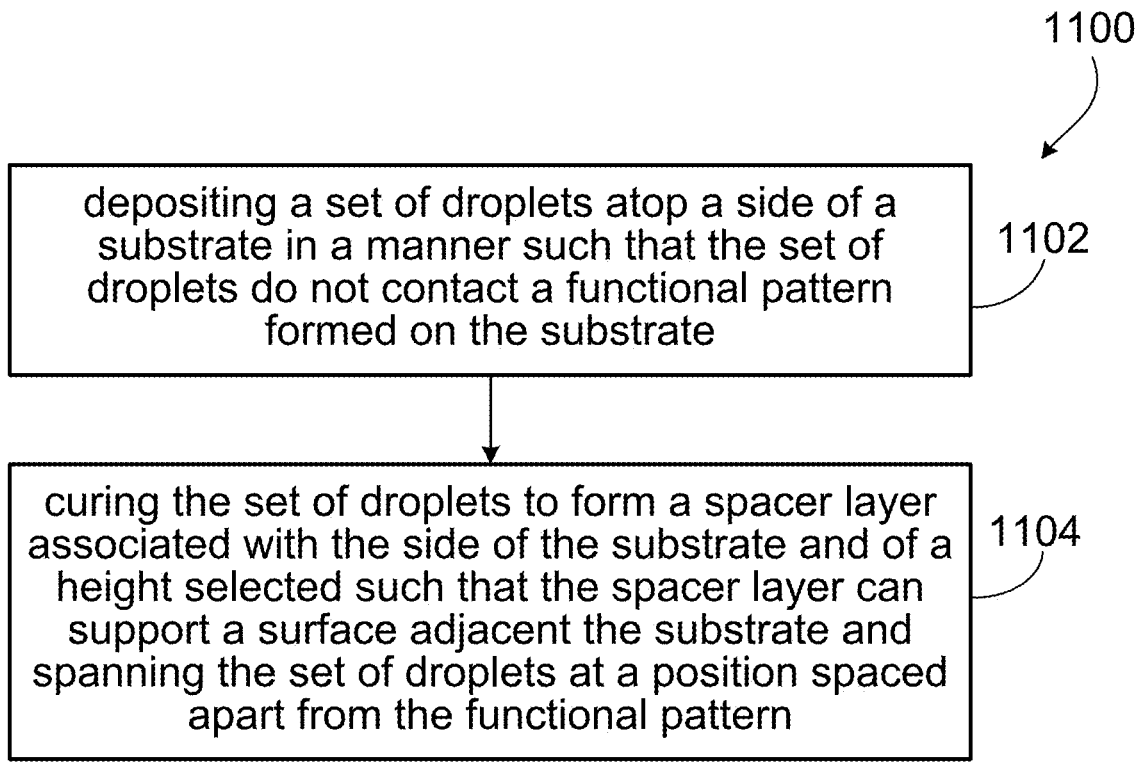
FIG. 14 is a flow chart of an example process for configuring an optical layer in an imprint lithography process.

FIG. 14 displays a flow chart of an example process 1100 for configuring an optical layer (e.g., the optical layer 200, 600) in an imprint lithography process. A set of droplets (e.g., the spacers or drops 212, 300, 400, 850, 860, 870, 912, 1012, 1082 in an uncured state) is deposited atop a side (e.g., the upper side 208 or the lower side 214) of a substrate (e.g., the substrate 202, 802, 902, 1002) in a manner such that the set of droplets do not contact a functional pattern (e.g., the functional pattern 204) formed on the substrate (1102). In some examples, each droplet of the set of droplets has a volume of about 1 pL to about 100 pL. In some embodiments, the process further includes generating a drop-on demand programming scheme. In some examples, the process further includes providing a printing screen (e.g., the screen 940 or the screen used to produce the spacer layer 1000). In some embodiments, the process further includes imprinting the functional pattern on the substrate.

The set of droplets is cured to form a spacer layer (e.g., the spacer layer 206, 606, 800, 900, 1000) associated with the side of the substrate and of a height selected such that the spacer layer can support a surface (e.g., a surface of a substrate 202, 802, 902, 1002 or of an optical layer 540) adjacent the substrate and spanning the set of droplets at a position spaced apart from the functional pattern. In some embodiments, depositing the set of droplets atop the side of the substrate includes dispensing droplet volumes of a polymerizable substance atop the side of the substrate. In some examples, the set of droplets has a cured height of a first order of magnitude (e.g., of a micro-scale). In some examples, the functional pattern has a height of a second order of magnitude (e.g., of a nano-scale).

In some examples, the set of droplets is a first set of droplets (e.g., the drops or deposits 850, 1050), and the process further includes depositing each drop of the first set of droplets directly on the side of the substrate, and curing the first set of droplets directly on the side of the substrate. In some examples, each droplet of the first set of droplets has a cured height of about 0.5 μm to about 20.0 μm. In some embodiments, after the first set of droplets is cured, the process further includes depositing a second set of droplets (e.g., the drops or deposits 860, 870, 1060) atop the side of the substrate such that each droplet of the second set of droplets is respectively dispensed directly atop a droplet of the first set of droplets and curing the second set of droplets directly atop the first set of droplets to increase a height of the spacer layer (e.g., the spacer layer 800, 1000). In some examples, a first number of droplets in the first set of droplets is equal to a second number of droplets in the second set of droplets such that the spacer layer (e.g., the spacer layer 206, 606, 900) has a uniform height (e.g., thickness). In some examples, a first number of droplets in the first set of droplets is not equal to a second number of droplets in the second set of droplets such that the spacer layer (e.g., the spacer layer 800, 1000) has a variable height (e.g., thickness). For example, a spacer layer of variable thickness may have a wedge shape.

In some embodiments, the functional pattern is imprinted on the side (e.g., the upper side 208) of the substrate. In some embodiments, the functional pattern is imprinted along an interior region (e.g., the interior region 218) of the side of the substrate, and the process further includes depositing the set of droplets along a peripheral edge (e.g., the peripheral edge 216) of the side of the substrate. In some embodiments, the side (e.g., the lower side 214) of the substrate is a first side of the substrate, and the functional pattern is imprinted on a second side of the substrate that is opposite the first side of the substrate. In some embodiments, the process further includes depositing the set of droplets across an entirety of the first side of the substrate.

In some embodiments, the process further includes attaching the substrate to the surface adjacent the substrate at the set of droplets such that the spacer layer forms a gap (e.g., the gap 530, 730, 858, 878, 930, 1030) between the substrate and the surface. In some examples, the gap provides a low index region. In some examples, the low index region is air with an index of refraction of 1.

Advantageously, the process 1100 can be used to produce a spacer layer on a substrate in a manner that more accurately positions spacers, more precisely sizes spacers, and improves a mechanical integrity of spacers as compared to spacer layers produced via other techniques, such as using a tube or a nozzle to apply a continuous paste of polymer material. For example, a polymerizable substance can be accurately dispensed as droplets according to a programmed drop-on-demand mapping scheme along a peripheral edge of a substrate on a same side as which a functional pattern is imprinted without contacting the functional pattern and therefore without interfering with an optical integrity of the functional pattern. In other examples, a polymerizable substance can be accurately dispensed as droplets across an entire side of a substrate that is opposite a side on which a functional pattern is imprinted to produce desired optical effects or to provide structural support. Furthermore, properties of the polymerizable substance, as well as a precise dispense volume of the polymerizable substance, can yield precisely formed spacers that vary in height by as little as 5% across an area of a substrate. This allows for precise control of gap thickness. Furthermore, due to drop-on-drop stacking, the gap thickness can be changed as desired or customized to produce a gap of non-uniform thickness. Additionally, an elasticity of such spacers in a cured state provides the spacers with a mechanical integrity that is sufficient for supporting adjoined and adjacent substrates in a manner that prevents bowing or warping along interior regions of the substrates.

While the spacer layers and the optical devices discussed above have been described and illustrated as defining a gap that is filled with air, in some embodiments, a spacer layer or an optical device that is otherwise similar in construction and function to any of the spacer layers or optical devices discussed above may define a gap that is filled with a polymerizable material. In some embodiments, the polymerizable material has an index of refraction in a range of 1.3-1.6. In some embodiments, the polymerizable material has an index of refraction that is equal to an index of refraction of the cured set of droplets that forms the spacer layer.

While a number of embodiments have been described for illustration purposes, the foregoing description is not intended to limit the scope of the invention, which is defined by the scope of the appended claims. There are and will be other examples, modifications, and combinations within the scope of the following claims.

What is claimed is:

1. An imprint lithography method of configuring an optical layer, the imprint lithography method comprising:
   depositing a first set of droplets onto a substrate that comprises a functional pattern;
   curing the first set of droplets to form a spacer layer associated with the substrate and of a height selected such that the spacer layer can support a surface adjacent the substrate and spanning the first set of droplets
   depositing a second set of droplets atop the substrate such that each droplet of the second set of droplets is respectively dispensed atop a droplet of the first set of droplets; and
   curing the second set of droplets to increase a height of the spacer layer, wherein a first number of droplets in the first set of droplets is not equal to a second number of droplets in the second set of droplets such that the spacer layer has a variable height.

2. The imprint lithography method of claim 1, wherein each droplet of the first set of droplets has a volume of about 1 pL to about 100 pL.

3. The imprint lithography method of claim 1, further comprising generating a drop-on demand programming scheme.

4. The imprint lithography method of claim 1, further comprising providing a printing screen.

5. The imprint lithography method of claim 1, further comprising imprinting the functional pattern on the substrate.

6. The imprint lithography method of claim 1, wherein depositing the first set of droplets onto the substrate comprises dispensing droplet volumes of a polymerizable substance onto the substrate.

7. The imprint lithography method of claim 1, further comprising:
   depositing each droplet of the first set of droplets directly on the substrate; and
   curing the first set of droplets directly on the substrate.

8. The imprint lithography method of claim 1, wherein each droplet of the first set of droplets has a cured height of about 0.5 μm to about 20.0 μm.

9. The imprint lithography method of claim 8, further comprising, after the first set of droplets is cured:
   depositing each droplet of the second set of droplets directly atop a droplet of the first set of droplets; and curing the second set of droplets directly atop the first set of droplets to increase a height of the spacer layer.

10. The imprint lithography method of claim 9, wherein the spacer layer has a wedge shape.

11. The imprint lithography method of claim 1, wherein the functional pattern is imprinted onto the substrate.

12. The imprint lithography method of claim 11, wherein the functional pattern is imprinted along an interior region of the substrate, the imprint lithography method further comprising depositing the first set of droplets along a peripheral edge of the substrate.

13. The imprint lithography method of claim 1, wherein the functional pattern is imprinted on a side of the substrate that is opposite the first set of droplets.

14. The imprint lithography method of claim 13, further comprising depositing the first set of droplets across an entirety of a portion of the substrate.

15. The imprint lithography method of claim 1, further comprising attaching the substrate to the surface adjacent the substrate at the first set of droplets such that the spacer layer forms a gap between the substrate and the surface.

16. The imprint lithography method of claim 1, wherein the gap provides a low index region having an index of refraction in a range of about 1.0 to about 1.2.

17. The imprint lithography method of claim 16, wherein the low index region comprises air.

18. The imprint lithography method of claim 17, wherein the low index region has an index of refraction of 1.

19. An optical layer, comprising:
   a substrate;
   a functional pattern formed on the substrate;
   a first cured set of droplets disposed on the substrate, the first cured set of droplets forming a spacer layer associated with the substrate and of a height selected such that the spacer layer can support a surface adjacent the substrate and spanning the first cured set of droplets; and
   a second cured set of droplets, each droplet of the second cured set of droplets atop a cured droplet of the first cured set of droplets, thereby increasing a height of the spacer layer relative to the first cured set of droplets,
   wherein a number of droplets in the first set of cured droplets is not equal to a number of droplets in the second cured set of droplets, such that the spacer layer has a variable height.

* * * * *